United States Patent
Gu et al.

(10) Patent No.: US 10,418,422 B2
(45) Date of Patent: Sep. 17, 2019

(54) ORGANIC LIGHT-EMITTING DEVICE AND METHOD OF MANUFACTURING THE SAME

(71) Applicant: Wuhan China Star Optoelectronics Technology Co., Ltd., Wuhan, Hubei (CN)

(72) Inventors: Yu Gu, Guangdong (CN); Hsiang-Lun Hsu, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 99 days.

(21) Appl. No.: 15/311,627

(22) PCT Filed: Sep. 14, 2016

(86) PCT No.: PCT/CN2016/098944
§ 371 (c)(1),
(2) Date: Nov. 16, 2016

(87) PCT Pub. No.: WO2018/028020
PCT Pub. Date: Feb. 15, 2018

(65) Prior Publication Data
US 2018/0182825 A1   Jun. 28, 2018

(30) Foreign Application Priority Data

Aug. 10, 2016  (CN) .......................... 2016 1 0654099

(51) Int. Cl.
*H01L 27/32* (2006.01)
*H01L 51/56* (2006.01)

(52) U.S. Cl.
CPC .......... *H01L 27/3213* (2013.01); *H01L 27/32* (2013.01); *H01L 27/322* (2013.01); *H01L 51/56* (2013.01); *H01L 27/3218* (2013.01)

(58) Field of Classification Search
CPC ... H01L 27/3213; H01L 27/322; H01L 51/56; H01L 27/3244; H01L 27/3209; H01L 25/048; H01L 27/3218
(Continued)

(56) References Cited

U.S. PATENT DOCUMENTS 9,219,087 B2    12/2015  Jinta
2004/0113875 A1*  6/2004  Miller ................. G09G 3/3216
345/82

(Continued)

FOREIGN PATENT DOCUMENTS

CN    105428390 A    3/2016
CN    106298854 A    1/2017

*Primary Examiner* — Dzung Tran
(74) *Attorney, Agent, or Firm* — Andrew C. Cheng (57) ABSTRACT

An organic light-emitting device includes a substrate, a first electrode layer, a light-emitting layer, and a second electrode arranged in layers. The light-emitting layer includes primary pixels, each of which includes three or more subpixels. One of the subpixels is a white subpixel. The other subpixels includes a basic subpixel which has a light-emitting material necessary to synthesize the white light. The basic subpixels includes an original color zone and a synthesized color zone. The light-emitting material for the synthesized white light corresponding to the synthesized color zone of the basic subpixels and another kind of light-emitting material for the synthesized white light are layered or mixed to form the subpixel with the white light. The brightness and color of the image is enhanced, power consumes less, and the life span of the organic light-emitting device is extended.

7 Claims, 4 Drawing Sheets (58) Field of Classification Search
USPC .......................... 257/40, 59, 98, 72; 345/690
See application file for complete search history.

(56) References Cited

U.S. PATENT DOCUMENTS

| | | | |
|---|---|---|---|
| 2005/0225232 A1* | 10/2005 | Boroson | H01L 27/3213 |
| | | | 313/504 |
| 2006/0231842 A1* | 10/2006 | Hirakata | H01L 25/048 |
| | | | 257/72 |
| 2007/0228938 A1* | 10/2007 | Hatwar | H01L 27/3213 |
| | | | 313/504 |
| 2011/0037071 A1* | 2/2011 | Ozawa | H01L 27/3211 |
| | | | 257/59 |
| 2014/0183471 A1 | 7/2014 | Heo | |
| 2015/0311269 A1 | 10/2015 | Hsu | |
| 2016/0189611 A1 | 6/2016 | Jinta | |

\* cited by examiner

| 301 |
| --- |
| Arrange a substrate layer, a first electrode layer, a light-emitting layer, and a second electrode in layers to form a display panel including a plurality of primary pixels arranged in a display zone. Each of the primary pixels has three or more subpixels. One of the three or more subpixels is a white subpixel. One or more of the other subpixels includes a basic subpixel which has a light-emitting material necessary to synthesize the white light. |

| 302 |
| --- |
| Adopt the mask with the fourth aperture to form a function layer apart from the light-emitting layer of all of the subpixels. |

ORGANIC LIGHT-EMITTING DEVICE AND METHOD OF MANUFACTURING THE SAME

BACKGROUND

1. Field of the Disclosure

The present disclosure relates to display technology, and more particularly, to an organic light-emitting device and a method of manufacturing the organic light-emitting device.

2. Description of the Related Art

Organic light-emitting diode (OLED) device features high efficiency, high brightness, wide view angles, low power consumption, self-illumination, low driver voltage, swift response speed, full colors, full of flexibility, easy processing, suitable to wildlife use, etc. Owing to these features, a display device with the OLED performs better and contains larger amount of information and can fulfill the requirements demanded by the era of information technology.

Generally, three primary subpixels (i.e., red (R), green (G), and blue (B) primary colors) are arranged to obtain white background color in a conventional OLED device. Only when the RGB subpixels are lit at the same time does the white background color is obtained. However, such a design consumes a larger amount of electricity than a simple white light device does. The display device with the design consumes larger power as well.

With the arranging of the four white (W) subpixel with the white light in one pixel zone, the white light is obtained without lighting the RBG color subpixels at the same time. However, it is necessary to attach a corresponding red filter film, a corresponding blue filter film, and a corresponding green filter film to a cover to form the RBG colors even though the method of arranging the four W subpixels with the white light in one pixel zone is adopted. The light emitted by the RBG color subpixels needs to pass through three color filters with this method. Inevitably, the energy of the light is partially lost, and the display device with the design consumes larger power as well.

Conventionally, the WRGB subpixels are arranged in one pixel zone independently so that no color filters are needed. However, during the process of fabricating the WRGB subpixels, a light-emitting layer corresponding to each of the WRGB or more subpixels needs to be provided with an independent mask. Also, it costs much to produce, transport, clean, and maintain the masks. In sum, it is disadvantage of the development of the OLED technique.

SUMMARY

An object of the present disclosure is to propose an organic light-emitting device and a method of manufacturing the organic light-emitting device to solve the problems that the power consumption of a conventional organic light-emitting device is high, and the production cost of a conventional organic light-emitting device is high as well.

In a first aspect of the present disclosure, an organic light-emitting device comprises: a substrate, a first electrode layer, a light-emitting layer, and a second electrode arranged in layers; the light-emitting layer comprising a plurality of primary pixels; each of the primary pixels comprising three or more subpixels; one of the three or more subpixels being a white subpixel; two or more of the other subpixels comprising a basic subpixel which has a light-emitting material necessary to synthesize the white light; two or more of the basic subpixels comprising an original color zone and a synthesized color zone; the light-emitting material for the synthesized white light corresponding to the synthesized color zone of two or more of the basic subpixels and another kind of light-emitting material for the synthesized white light being layered or mixed to form the subpixel with the white light. All function layers apart from the light-emitting layers of all of the subpixels are integrally formed. The number of the basic subpixel is three. The three subpixels are a blue subpixel, a red subpixel, and a green subpixel. The blue subpixel and the red subpixel both comprise an original color zone and a synthesized color zone. The light-emitting layer of the original color zone and the light-emitting layer of the synthesized color zone are the same blue light-emitting layer. The yellow light-emitting material for synthesizing the white color corresponds to the red subpixel.

Furthermore, a filter layer corresponding to the red subpixel original color zone for filtering the red light only is arranged.

In a second aspect of the present disclosure, an organic light-emitting device comprises: a substrate, a first electrode layer, a light-emitting layer, and a second electrode arranged in layers; the light-emitting layer comprising a plurality of primary pixels; each of the primary pixels comprising three or more subpixels; one of the three or more subpixels being a white subpixel; one or more of the other subpixels comprising a basic subpixel which has a light-emitting material necessary to synthesize the white light; the basic subpixel comprising an original color zone and a synthesized color zone; the light-emitting material for the synthesized white light corresponding to the synthesized color zone and another kind of light-emitting material for the synthesized white light being layered or mixed to form the subpixel with the white light.

Furthermore, all function layers apart from the light-emitting layers of all of the subpixels are integrally formed.

Furthermore, the light-emitting material for synthesizing another kind of light-emitting material is formed on a zone corresponding to the white subpixel and one of the basic subpixels.

Furthermore, three or more of the basic subpixels comprise two or more basic subpixels, and the light-emitting material for the synthesized white light corresponding to the synthesized color zone of two or more of the basic subpixels and another kind of light-emitting material for the synthesized white light being are layered or mixed to form the subpixel with the white light.

Furthermore, the number of the basic subpixel is three. The three subpixels are a blue subpixel, a red subpixel, and a green subpixel. The blue subpixel and the red subpixel both comprising an original color zone and a synthesized color zone; the light-emitting layer of the original color zone and the light-emitting layer of the synthesized color zone are the same blue light-emitting layer; the yellow light-emitting material for synthesizing the white color corresponding to the red subpixel.

Furthermore, a filter layer corresponding to the red subpixel original color zone for filtering the red light only is arranged.

In a third aspect of the present disclosure, a method of producing an organic light-emitting device, comprises:

Arranging a substrate, a first electrode layer, a light-emitting layer, and a second electrode in layers to form a display panel comprising a plurality of primary pixels arranged in a display zone. Each of the primary pixels has three or more subpixels; one of the three or more subpixels is a white subpixel; one or more of the other subpixels comprises a basic subpixel which has a light-emitting material necessary to synthesize a white light. The basic subpixel comprise an original color zone and a synthesized color zone. The light-emitting material for the synthesized white light corresponding to the synthesized color zone and another kind of light-emitting material for the synthesized white light are layered or mixed to form the subpixel with the white light.

Furthermore, the method of forming the light-emitting layer comprises: adopting a mask with the size like a first aperture to form one of basic subpixels with the light-emitting material for synthesizing the white light; adopting the mask with the size like a second aperture to form the other basic subpixels; adopting the mask with the size like a third aperture to form another kind of light-emitting material for synthesizing the white light and arrange the light-emitting material on a zone corresponding to the white subpixel and one of the basic subpixels; both of the first aperture and the third aperture being larger than the second aperture.

Furthermore, the method of forming the light-emitting layer further comprises a step of: adopting the mask with a fourth aperture to form a function layer apart from the light-emitting layer of all of the subpixels; the area of the fourth aperture matching the area of the primary pixel.

Compared with the related art, the display zone in the organic light-emitting device includes a plurality of primary pixels. Each of the primary pixels includes three or more subpixels. One of the three or more subpixels is a white subpixel. One or more of the other subpixels includes a basic subpixel which has a light-emitting material necessary to synthesize the white light. The basic subpixel includes an original color zone and a synthesized color zone. The light-emitting material for the synthesized white light corresponding to the synthesized color zone and another kind of light-emitting material for the synthesized white light are layered or mixed to form the subpixel with the white light in the synthesized color zone. With the above-mentioned method of using the RGBW subpixels, the brightness and color of the image is enhanced, power consumes less and the life span of the organic light-emitting device is extended. Besides, the white subpixel is are layered or mixed with one or more basic subpixel(s) with the light-emitting material for the synthesized white light and another kind of light-emitting material for the synthesized white light. Compared with the related art, the present disclosure is that four pixels are formed via the four aperture of a mask. So the costs of the present disclosure are lower since the use of the mask in the present disclosure skips once.

DETAILED DESCRIPTION OF THE PREFERRED EMBODIMENTS

For the purpose of description rather than limitation, the following provides such specific details as a specific system structure, interface, and technology for a thorough understanding of the application. However, it is understandable by persons skilled in the art that the application can also be implemented in other embodiments not providing such specific details. In other cases, details of a well-known apparatus, circuit and method are omitted to avoid hindering the description of the application by unnecessary details.

Figure 1:
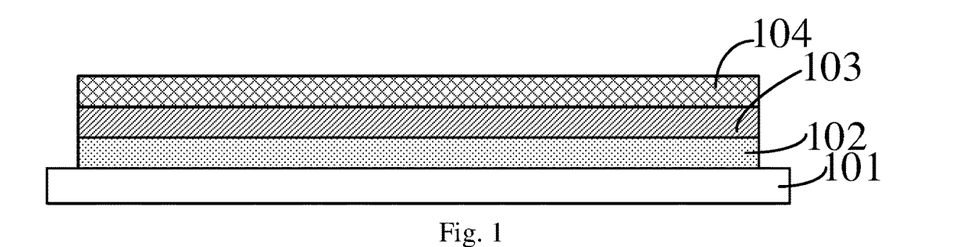
FIG. 1 is a schematic diagram of the structure of an organic light-emitting device according to an embodiment of the present disclosure.

Please refer to FIG. 1. FIG. 1 is a schematic diagram of the structure of an organic light-emitting device according to a first embodiment of the present disclosure.

The organic light-emitting includes a substrate 101, a first electrode layer 102, a light-emitting layer 103, and a second electrode layer 104. The substrate 101, the first electrode layer 102, the light-emitting layer 103, and the second electrode layer 104 are arranged in layers.

The substrate layer 101 is a transparent substrate. The substrate layer 101 may be a glass substrate or a flexible substrate. Provided that the substrate layer 101 is a flexible substrate, polyester, one kind of polyimide (PI) compound, or many kinds of polyimide (PI) compounds can be the material for the substrate layer 101.

The first electrode layer 102 is an anode layer of the organic light-emitting device. The second electrode layer 104 is a cathode layer of the organic light-emitting device.

The first electrode layer (i.e., the anode layer) 102 can be made from an inorganic material or an organic conductive compound. The inorganic material may be a metal of a metal compound. The metal is a metal with a higher work function, including gold, copper, silver, etc. The metal compound is specifically indium tin oxide (ITO), zinc oxide, oxide ZnSnO3, etc. The organic conductive compound is polythiophene (PT), sodium dodecyl benzene sulfonate (SDBS), or polyaniline.

The second electrode layer (i.e., the cathode layer) 104 can be made from a metal or a metal alloy. The metal is a metal with a lower work function, including lithium, magnesium, calcium, strontium, aluminum, indium, etc. The metal alloy may be a metal alloy with a lower work function or an alloy of the metal alloy with a lower work function and gold, silver, and copper. In another embodiment of the present disclosure, the second electrode layer 104 is a cathode layer of a metal and a metal fluoride which alternatively formed. For example, the cathode layer is formed after lithium fluoride and silver and lithium fluoride and aluminum are alternatively formed.

The light-emitting layer 103 is produced by a light-emitting material and a phosphorescence light-emitting dopant. But the light-emitting material and the phosphorescence light-emitting dopant are not limited by the present disclosure.

The display zone of the organic light-emitting device formed by the substrate layer 101, the first electrode layer 102, the light-emitting layer 103, and the second electrode layer 104 is a light-emitting layer 103. The light-emitting layer 103 includes a plurality of primary pixels. Each of the primary pixels includes three or more subpixels. One of the three or more subpixels is a white subpixel. One or more of the other subpixels includes a basic subpixel which has a light-emitting material necessary to synthesize the white light. The basic subpixel includes an original color zone and a synthesized color zone. The light-emitting material for the synthesized white light corresponding to the synthesized color zone and another kind of light-emitting material for the synthesized white light are layered or mixed to form the subpixel with the white light.

Figure 2A:
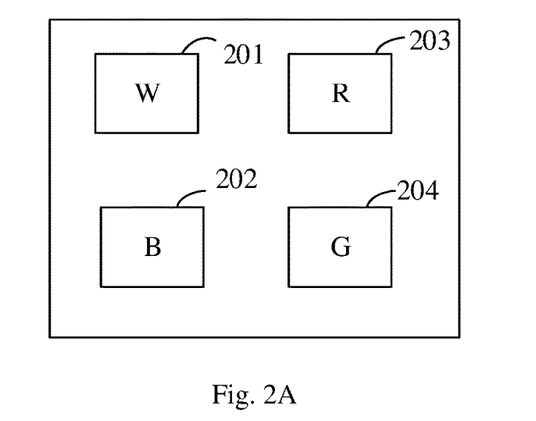
FIG. 2A is a schematic diagram of the structure of a primary pixel in a display zone in an organic light-emitting device according to a first embodiment of the present disclosure.
Figure 2B:
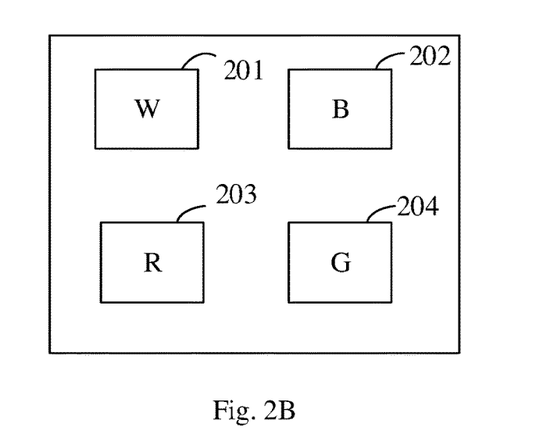
FIG. 2B is a schematic diagram of the structure of a primary pixel in a display zone in an organic light-emitting device according to a second embodiment of the present disclosure.

Please refer to FIG. 2A related to another preferred embodiment of the present disclosure. FIG. 2A is a schematic diagram of the structure of a primary pixel in a display zone in an organic light-emitting device according to an embodiment of the present disclosure. The display zone includes four subpixels. A W subpixel 201 is a white light subpixel. The number of the basic subpixel is three, that is, a blue subpixel B 202, a red subpixel R 203, and a green subpixel G 204. In another preferred embodiment, the white light subpixel and the three basic subpixels may further be shown differently. For example, a blue subpixel B 202, a red subpixel R 203, and a white subpixel W 201 are exactly adjacent, as shown in FIG. 2B. No restrictions are defined in the present disclosure.

The red subpixel R 203 includes an original color (red) zone and a synthesized color zone. The synthesized color zone includes a yellow light-emitting material for synthesizing the white light. Specifically, the yellow light-emitting material is layered or mixed with the light-emitting material arranged on the blue subpixel Bs 202 adjacent to the W subpixel 201. The blue light-emitting material and the yellow light-emitting material are compensated in color and emit the white light so the zone where the light-emitting material for the W subpixel 201 and the light-emitting material for the blue subpixel Bs 202 are layered or mixed to form the W subpixel 201 and emit the white light.

For the zone of the blue subpixel B 202 where the light-emitting material for the yellow light is synthesized or layered, the white light is emitted. As for the other zone of the blue subpixel B 202 where the light-emitting material for the yellow light is not synthesized or layered, the blue light is emitted as usual.

In addition, the light-emitting material for the green subpixel G 204 is used to emit the green light.

The original color zone of the red subpixel R 203 includes a red zone. The red zone emits the red light. After the disposition of mixed zone and the mix or arrangement in layers of the synthesized light-emitting materials of the blue subpixel B 202 and the yellow light, the four colors of pixels are shown. No additional costs are spent.

Figure 2C:
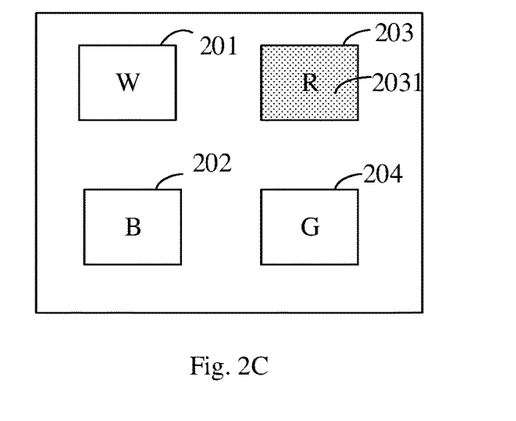
FIG. 2C is a schematic diagram of the structure of a primary pixel in a display zone in an organic light-emitting device according to a third embodiment of the present disclosure.

In another embodiment, the light-emitting material for the synthesized color zone of the red subpixel R 203 includes a yellow light-emitting material for synthesizing the white light. To purify the red light emitted by the organic light-emitting device to the utmost to prevent the light-emitting layer formed by the yellow light-emitting material from partially covering the red color zone, a red filter layer 2031 is attached to the red subpixel R zone 203 (i.e., the R subpixel original color zone) corresponding to a glass cover of the organic light-emitting device. As FIG. 2C shows, only the red light can passes through the red filter layer 2031.

In another embodiment, the blue subpixel B also includes an original color zone and a synthesized color zone. The blue light-emitting material for the synthesized color zone of the blue subpixel B and the yellow light-emitting material for the synthesized color zone of the red subpixel R are layered or mixed, and the white light is emitted. The original color zone of the blue subpixel B and the synthesized color zone of the blue subpixel B share the same light-emitting layer with the same light-emitting material, i.e., the blue light-emitting layer.

In any of the above-mentioned embodiments, one basic subpixel of the light-emitting material for synthesizing the white light in the organic light-emitting device is formed via a mask with the size like a first aperture. Take the formation of the red subpixel for example. To start with, the yellow light-emitting material for synthesizing the white light is formed via the mask with the first aperture. In another embodiment, the red light-emitting material is further formed to form a light-emitting layer showing the red subpixel original color while the yellow light-emitting material is formed. In another embodiment, the basic subpixel can further be a blue subpixel. This embodiment doesn't restrict it.

The green basic subpixel of the organic light-emitting device is formed via a mask with a second aperture. The second aperture of the mask is smaller than the first aperture.

Another basic subpixel with the light-emitting material for synthesizing the white light is formed with a mask with the size like a third aperture. When the mask with the first aperture forms the red subpixel, the mask with the third aperture forms the blue subpixel. When the mask with the first aperture forms the blue subpixel, the mask with the third aperture forms the red subpixel. This embodiment does not restrict it. The third aperture is larger than the second aperture.

Moreover, in the above-mentioned embodiments, the filter layer corresponding to the red subpixel zone for filtering the red light only is arranged on a cover glass corresponding to the red subpixel original color zone of the organic light-emitting device through an inkjet printing or other methods.

It is notified that the mask with different sizes like the different apertures forming the each of the subpixels on the organic glass device is not limited to the above-mentioned method. In other embodiments, at first, the mask with the size of the second aperture forms the green basic subpixel; next, the mask with the size of the first aperture forms the red subpixel of the red light-emitting material for synthesizing the white light, and the mask with the size of the third aperture forms the blue subpixel. This embodiment does not restrict it.

The present disclosure is that four pixels are formed via the four aperture of the mask. Compared with the related art, the costs of the present disclosure are lower since the use of the mask in the present disclosure skips once.

In addition, in the above-mentioned embodiment, the organic light-emitting device includes function layers, such as a hole injection layer (HTL), a hole transport layer (HTL), an electron stopper layer (ESL), a hole blocking layer (HBL), an electron transport layer (ETL), and an electron injection layer (EIL), apart from the light-emitting layer for the three or more subpixels. The function layers are shared and some of the zones are integrally formed.

The function layer is formed via a mask with a fourth aperture 8 The area of the fourth aperture matches the area of the primary pixel.

Compared with the related art, the display zone in the organic light-emitting device includes a plurality of primary pixels. Each of the primary pixels includes three or more subpixels. One of the three or more subpixels is a white subpixel. One or more of the other subpixels includes a basic subpixel which has a light-emitting material necessary to synthesize the white light. The basic subpixel includes an original color zone and a synthesized color zone. The light-emitting material for the synthesized white light corresponding to the synthesized color zone and another kind of light-emitting material for the synthesized white light are layered or mixed to form the subpixel with the white light in the synthesized color zone. With the above-mentioned method of using the RGBW subpixels, the brightness and color of the image is enhanced, power consumes less, and the life span of the organic light-emitting device is extended. Besides, the white subpixel is are layered or mixed with one or more basic subpixel(s) with the light-emitting material for the synthesized white light and another kind of light-emitting material for the synthesized white light. Compared with the related art, the present disclosure is that four pixels are formed via the four aperture of a mask. So the costs of the present disclosure are lower since the use of the mask in the present disclosure skips once.

In addition, the red light emitted by the organic device is more purified through controlling the structure of the subpixel reasonably and arranging the filter layer corresponding to the red subpixel original color zone for filtering the red light only to eliminating the light-emitting material for synthesizing the white light in the red subpixel. The light-emitting material for synthesizing the white light may affect the red light.

Figure 3:
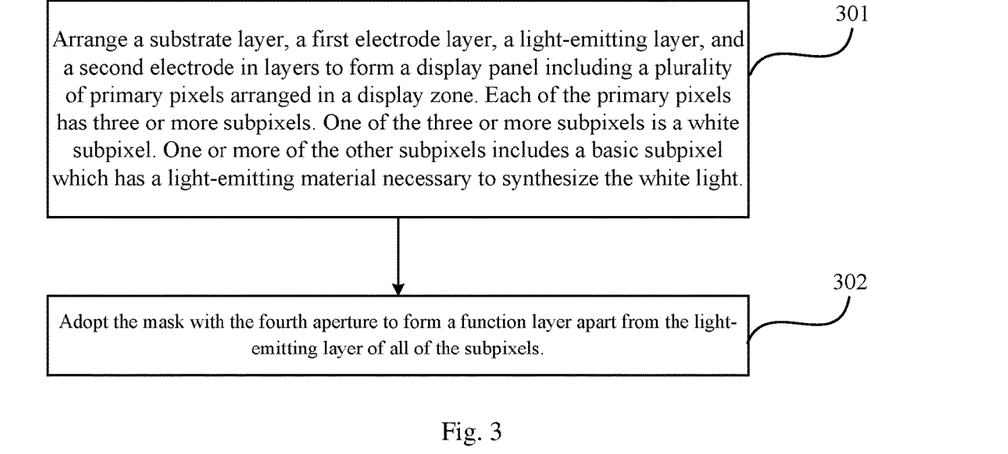
FIG. 3 is a flowchart diagram illustrating a method of producing an organic light-emitting device according to an embodiment of the present disclosure.

Please refer to FIG. 3. FIG. 3 is a flowchart diagram illustrating a method of producing an organic light-emitting device according to an embodiment of the present disclosure. The method includes the following steps.

Step 301: Arrange a substrate layer, a first electrode layer, a light-emitting layer, and a second electrode in layers to form a display panel including a plurality of primary pixels arranged in a display zone.

Each of the primary pixels has three or more subpixels. One of the three or more subpixels is a white subpixel. One or more of the other subpixels includes a basic subpixel which has a light-emitting material necessary to synthesize the white light.

The basic subpixel includes an original color zone and a synthesized color zone. The light-emitting material for the synthesized white light corresponding to the synthesized color zone and another kind of light-emitting material for the synthesized white light are layered or mixed to form the subpixel with the white light.

The substrate layer is a transparent substrate. The substrate layer may be a glass substrate or a flexible substrate. Provided that the substrate layer is a flexible substrate, polyester, one kind of polyimide (PI) compound, or many kinds of polyimide (PI) compounds can be the material for the substrate layer.

The first electrode layer is an anode layer of the organic light-emitting device. The second electrode layer is a cathode layer of the organic light-emitting device.

The anode layer can be made from an inorganic material or an organic conductive compound. The inorganic material may be a metal of a metal compound. The metal is a metal with a higher work function, including gold, copper, silver, etc. The metal compound is specifically indium tin oxide (ITO), zinc oxide, oxide ZnSnO3, etc. The organic conductive compound is polythiophene (PT), sodium dodecyl benzene sulfonate (SDBS), or polyaniline.

The cathode layer can be made from a metal or a metal alloy. The metal is a metal with a lower work function, including lithium, magnesium, calcium, strontium, aluminum, indium, etc. The metal alloy may be a metal alloy with a lower work function or an alloy of the metal alloy with a lower work function and gold, silver, and copper. In another embodiment of the present disclosure, the second electrode layer is a cathode layer of a metal and a metal fluoride which alternatively formed. For example, the cathode layer is formed after lithium fluoride and silver and lithium fluoride and aluminum are alternatively formed.

The light-emitting layer is produced by a light-emitting material and a phosphorescence light-emitting dopant. But the light-emitting material and the phosphorescence light-emitting dopant are not limited by the present disclosure.

Step 302: Adopt the mask with the fourth aperture to form a function layer apart from the light-emitting layer of all of the subpixels.

Figure 4:
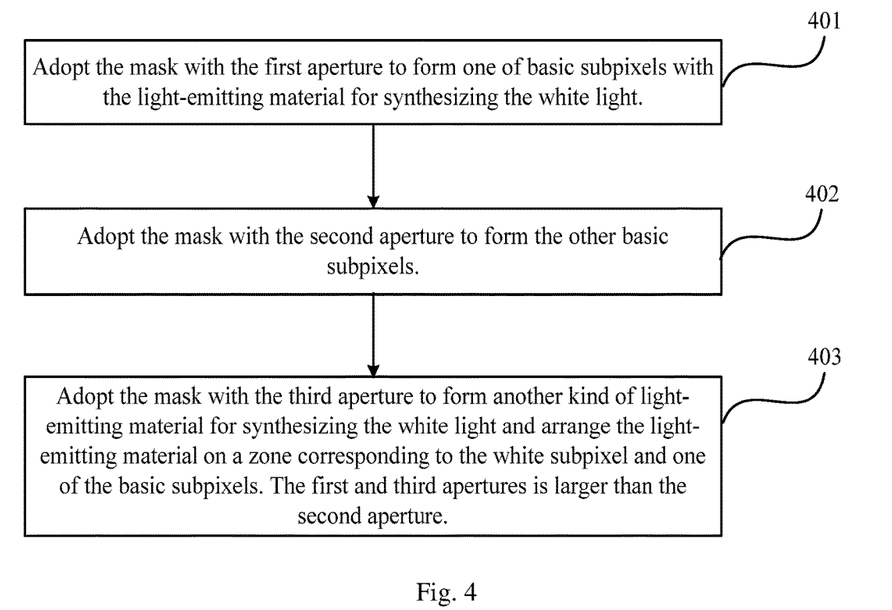
FIG. 4 is a flowchart illustrating a method of producing a light-emitting layer of an organic light-emitting device according to another embodiment of the present disclosure.

Please refer to FIG. 4. FIG. 4 is a flowchart illustrating a method of producing a light-emitting layer in an organic light-emitting device according to another embodiment of the present disclosure. The method of producing the light-emitting layer includes the following steps.

Step 401: Adopt the mask with the first aperture to form one of basic subpixels with the light-emitting material for synthesizing the white light.

Specifically, the display zone includes four subpixels. A W subpixel is a white light subpixel. The number of the basic subpixel is three, that is, a blue subpixel B, a red subpixel R, and a green subpixel G. It is notified that the display of the four subpixels is not restricted except that the blue subpixel B, the red subpixel R, and the white subpixel W are exactly adjacent. No other restrictions are defined in this embodiment.

The red subpixel R includes an original color (red) zone and a synthesized color zone. The synthesized color zone includes a yellow light-emitting material for synthesizing the white light. Specifically, the yellow light-emitting material is layered or mixed with the light-emitting material arranged on the blue subpixel Bs adjacent to the W subpixel. The blue light-emitting material and the yellow light-emitting material are compensated in color and emit the white light so the zone where the light-emitting material for the W subpixel and the light-emitting material for the blue subpixel Bs are layered or mixed to form the W subpixel and emit the white light.

Figure 5A:
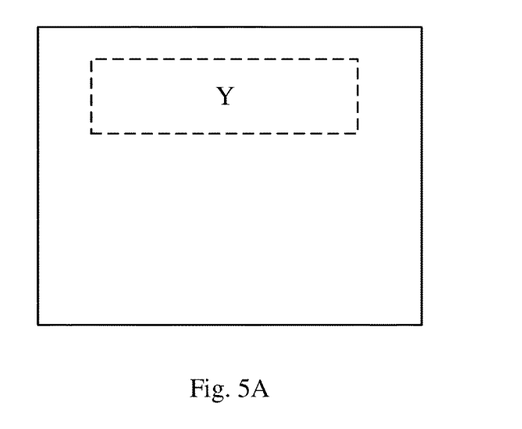
FIG. 5A illustrates a structure of a light-emitting layer of an organic light-emitting device using the method illustrated in FIG. 4 according to a first embodiment of the present disclosure.

For the organic light-emitting device, one basic subpixel of the light-emitting material for synthesizing the white light is formed via the mask with the first aperture, as FIG. 5A shows. Y is the light-emitting material for synthesizing the white light. Take the formation of the red subpixel for example. To start with, the yellow light-emitting material for synthesizing the white light is formed via the mask with the first aperture. In another embodiment, the red light-emitting material is further formed to form a light-emitting layer showing the red subpixel original color while the yellow light-emitting material is formed. In another embodiment, the basic subpixel can further be a blue subpixel. This embodiment doesn't restrict it.

Step 402: Adopt the mask with the second aperture to form the other basic subpixels.

Figure 5B:
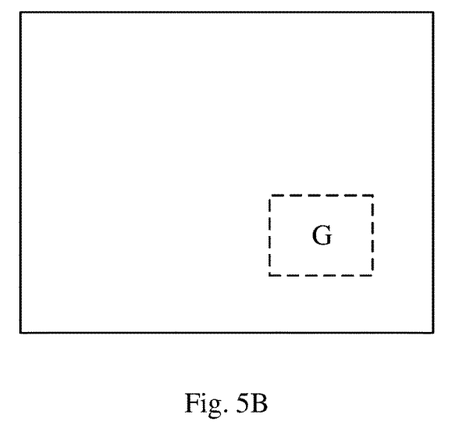
FIG. 5B illustrates a structure of a light-emitting layer of an organic light-emitting device using the method illustrated in FIG. 4 according to a second embodiment of the present disclosure.

Specifically, the green basic subpixel of the organic light-emitting device is formed via the mask with the second aperture. As FIG. 5B shows, the green subpixel G is formed, and the green light is emitted.

The second aperture of the mask is smaller than the above-mentioned first aperture.

Figure 5C:
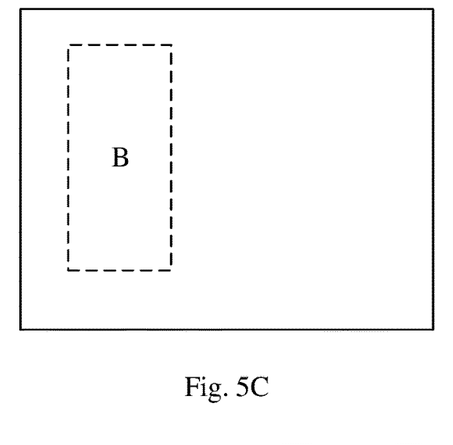
FIG. 5C illustrates a structure of a light-emitting layer of an organic light-emitting device using the method illustrated in FIG. 4 according to a third embodiment of the present disclosure.
Figure 5D:
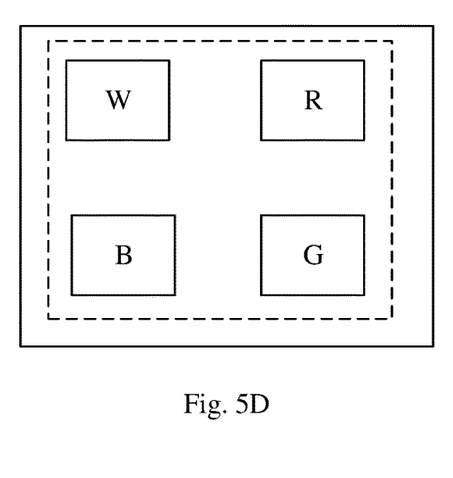
FIG. 5D illustrates a structure of a light-emitting layer of an organic light-emitting device using the method illustrated in FIG. 3 according to a fourth embodiment of the present disclosure.

Step 403: Adopt the mask with the third aperture to form another kind of light-emitting material for synthesizing the white light and arrange the light-emitting material on a zone corresponding to the white subpixel and one of the basic subpixels, as shown in FIG. 5C. Both of the first aperture and the third aperture are larger than the second aperture.

Another basic subpixel with the light-emitting material for synthesizing the white light is formed with a mask with the size like a third aperture. When the mask with the first aperture forms the red subpixel, the mask with the third aperture forms the blue subpixel. When the mask with the first aperture forms the blue subpixel, the mask with the third aperture forms the red subpixel. This embodiment does not restrict it. The third aperture is larger than the second aperture.

In addition, for the zone of the blue subpixel B where the light-emitting material for the yellow light is synthesized or layered, the white light is emitted. As for the other zone of the blue subpixel B where the light-emitting material for the yellow light is not synthesized or layered, the blue light is emitted as usual. The light-emitting layer showing the blue light is also formed via the mask with the third aperture.

In another embodiment, the light-emitting material for the synthesized color zone of the red subpixel R includes a yellow light-emitting material for synthesizing the white light. To purify the red light emitted by the organic light-emitting device to the utmost to prevent the light-emitting layer formed by the yellow light-emitting material from partially covering the red color zone, a red filter layer is attached to the red subpixel R zone (i.e., the R subpixel original color zone) corresponding to a glass cover of the organic light-emitting device. As FIG. 2C shows, only the red light can passes through the red filter layer.

Moreover, in the above-mentioned embodiments, the filter layer corresponding to the red subpixel zone for filtering the red light only is arranged on a cover glass corresponding to the red subpixel original color zone of the organic light-emitting device through an inkjet printing or other methods.

It is notified that the mask with different sizes like the different apertures forming the each of the subpixels on the organic glass device is not limited to the above-mentioned method. In other embodiments, at first, the mask with the size of the second aperture forms the green basic subpixel; next, the mask with the size of the first aperture forms the red subpixel of the red light-emitting material for synthesizing the white light, and the mask with the size of the third aperture forms the blue subpixel. This embodiment does not restrict it.

The present disclosure is that four pixels are formed via the four apertures of the mask. Compared with the related art, the costs of the present disclosure are lower since the use of the mask in the present disclosure skips once.

Step 302: Adopt the mask with the fourth aperture to form a function layer apart from the light-emitting layer of all of the subpixels.

The area of the fourth aperture matches the area of the primary pixel.

In addition, in the above-mentioned embodiment, the organic light-emitting device includes function layers, such as a hole injection layer (HTL), a hole transport layer (HTL), an electron stopper layer (ESL), a hole blocking layer (HBL), an electron transport layer (ETL), and an electron injection layer (EIL), apart from the light-emitting layer for the three or more subpixels. The function layers are shared and some of the zones are integrally formed.

Compared with the related art, the display zone in the organic light-emitting device includes a plurality of primary pixels. Each of the primary pixels includes three or more subpixels. One of the three or more subpixels is a white subpixel. One or more of the other subpixels includes a basic subpixel which has a light-emitting material necessary to synthesize the white light. The basic subpixel includes an original color zone and a synthesized color zone. The light-emitting material for the synthesized white light corresponding to the synthesized color zone and another kind of light-emitting material for the synthesized white light are layered or mixed to form the subpixel with the white light in the synthesized color zone. With the above-mentioned method of using the RGBW subpixels, the brightness and color of the image is enhanced, power consumes less, and the life span of the organic light-emitting device is extended. Besides, the white subpixel is are layered or mixed with one or more basic subpixel(s) with the light-emitting material for the synthesized white light and another kind of light-emitting material for the synthesized white light. Compared with the related art, the present disclosure is that four pixels are formed via the four aperture of a mask. So the costs of the present disclosure are lower since the use of the mask in the present disclosure skips once.

In addition, the red light emitted by the organic device is more purified through controlling the structure of the subpixel reasonably and arranging the filter layer corresponding to the red subpixel original color zone for filtering the red light only to eliminating the light-emitting material for synthesizing the white light in the red subpixel. The light-emitting material for synthesizing the white light may affect the red light.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. An organic light-emitting device, comprising:
a substrate, a first electrode layer, a light-emitting layer, and a second electrode arranged in layers;
the light-emitting layer comprising a white subpixel, a blue subpixel, a red subpixel and a green subpixel; wherein
the blue subpixel includes a first original color zone and a first synthesized color zone, the first original color zone and the first synthesized color zone are each formed by blue light-emitting material;
the red subpixel includes a second original color zone and a second synthesized color zone, the second synthesized color zone is formed by yellow light-emitting material, and the second original color zone is formed by red light-emitting material;

the blue light-emitting material in the first synthesized color zone of the blue subpixel and the yellow light-emitting material in the second synthesized color zone of the red subpixel are layered or mixed to form a layer emitting white light corresponding to the white subpixel; the red light-emitting material in the second original color zone is configured to emit red lights, and the blue light-emitting material in the first original color zone is configured to emit blue lights; the green subpixel is formed by light-emitting material configured to emit green lights;

wherein all function layers apart from the light-emitting layer of all of the subpixels are integrally formed.

2. The organic light-emitting device of claim 1, further comprising only one filter layer attached to the second original color zone for filtering only the red light.

3. An organic light-emitting device, comprising:

a substrate, a first electrode layer, a light-emitting layer, and a second electrode arranged in layers;

the light-emitting layer comprising a plurality of primary pixels; each of the primary pixels comprising three or more subpixels; one of the three or more subpixels being a white subpixel; two or more of the other subpixels being basic subpixels which have light-emitting material necessary to synthesize the white light; wherein two or more of the other subpixels at least comprises a blue subpixel, a red subpixel and a green subpixel;

the blue subpixel includes a first original color zone and a first synthesized color zone, the first original color zone and the first synthesized color zone are each formed by blue light-emitting material;

the red subpixel includes a second original color zone and a second synthesized color zone, the second synthesized color zone is formed by yellow light-emitting material, and the second original color zone is formed by red light-emitting material;

the blue light-emitting material in the first synthesized color zone of the blue subpixel and the yellow light-emitting material in the second synthesized color zone of the red subpixel are layered or mixed to form a layer emitting white light corresponding to the white subpixel; the red light-emitting material in the second original color zone is configured to emit red lights, and the blue light-emitting material in the first original color zone is configured to emit blue lights; the green subpixel is formed by light-emitting material configured to emit green lights.

4. The organic light-emitting device of claim 3, wherein all function layers apart from the light-emitting layers of all of the subpixels are integrally formed.

5. The organic light-emitting device of claim 3, further comprising only one filter layer attached to the second original color zone for filtering only the red light.

6. The organic light-emitting device of claim 1, wherein the blue subpixel and the red subpixel are each adjacent to the white subpixel, and the first synthesized color zone is adjacent to the white subpixel.

7. The organic light-emitting device of claim 3, wherein the blue subpixel and the red subpixel are each adjacent to the white subpixel, and the first synthesized color zone is adjacent to the white subpixel.

* * * * *